United States Patent [19]

Lathlaen

[11] 4,287,573
[45] Sep. 1, 1981

[54] METHOD AND MEANS FOR COUPLING AN ELONGATED MAGNETIC DEVICE

[75] Inventor: Richard A. Lathlaen, Hatfield, Pa.

[73] Assignee: TRW, Inc., Cleveland, Ohio

[21] Appl. No.: 931,924

[22] Filed: Aug. 7, 1978

[51] Int. Cl.³ .......................................... G11C 11/155
[52] U.S. Cl. ................................... 365/133; 365/135; 29/602 R
[58] Field of Search ............... 365/133, 134, 135, 139, 365/157; 339/276 R; 29/602 R, 604, 882

[56] References Cited

U.S. PATENT DOCUMENTS

| | | | |
|---|---|---|---|
| 3,729,574 | 4/1973 | Weiner | 339/276 R |
| 4,182,928 | 1/1980 | Murphy et al. | 29/882 |

*Primary Examiner*—James W. Moffitt
*Attorney, Agent, or Firm*—Jacob Trachtman

[57] ABSTRACT

Method and means for coupling an elongated magnetic device such as a "Wiegand" wire to a magnetic circuit comprising the steps of shaping the ends of an elongated magnetic device to provide a high ratio of surface area to volume and a contact surface at each end, and connecting the contact surface of each end of said magnetic device to a conforming portion of a respective one of a pair of spaced ends of a flux conductive means to provide a magnetic path through said conductive means and magnetic device. The ends of the magnetic device are shaped by being compressed to provide flat surfaces on opposite sides and are connected by electric welding, clamping, soldering or adhering same with the flux conductive means. In one form the conductive means is provided with a shunt path for magnetic flux for reducing the reluctance of the coupling means, and controlling the proportion of magnetic flux passing through the elongated magnetic device.

42 Claims, 6 Drawing Figures

U.S. Patent Sep. 1, 1981 4,287,573
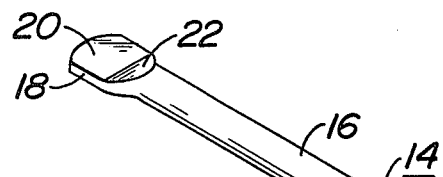
FIG. 1
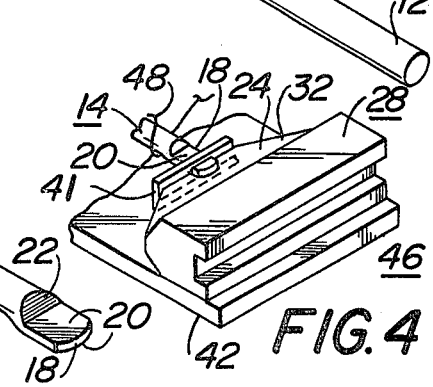
FIG. 2
FIG. 4
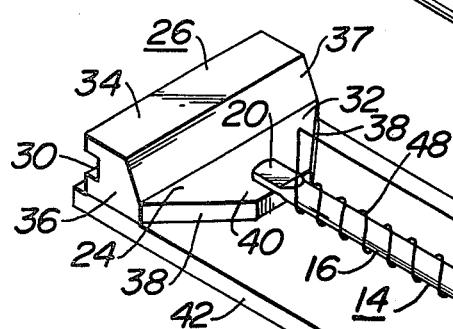
FIG. 3
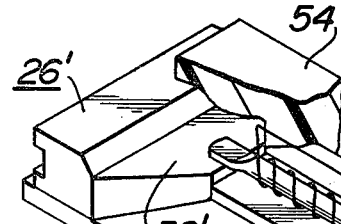
FIG. 5
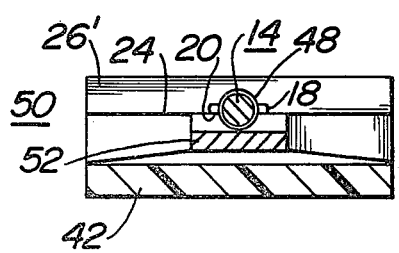
FIG. 6

METHOD AND MEANS FOR COUPLING AN ELONGATED MAGNETIC DEVICE

The invention relates to a method and means for coupling an elongated magnetic device to a magnetic circuit, and particularly a method and means for coupling to a magnetic circuit an elongated magnetic device such as a "Wiegand" wire which is highly sensitive to the density of magnetic flux.

Magnetic circuits like electric circuits, usually contain junctions or interfaces between a source of force and the channels through which the force acts. In the case of a magnetic circuit, the source provides a magnetomotive force which causes the flow of magnetic flux along closed paths. The magnetic flux may be channelled or concentrated by materials having high permeabilities which provide low circuit reluctance and increase the density of magnetic flux. Magnetically "soft" materials, such as soft iron, ferrite, and permalloy provide high permeability and low coercivity. On the other hand, air provides a permeability of 1 which is low compared to much higher values provided by the above materials. Air gaps are, therefore, utilized in the path of magnetic flux to introduce high reluctance into a circuit, and by varying the size of the air gap, the reluctance may be caused to vary resulting in corresponding inverse variations of magnetic flux. The magnetic flux may also be caused to vary by changing the amplitude or direction of applied magnetomotive force. Thus, where the source of force is a permanent magnet, the magnetomotive force applied to a circuit may be varied by changing the magnet's orientation, while if the source of force is an electromagnet, such changes may be effective by varying the amplitude of the energizing coil current.

In order to obtain a desired effect which is caused by variations in applied magnetomotive force or changes of reluctance of a magnetic circuit, it becomes desirable to minimize reluctance presented in other parts of the magnetic circuit. Since an undesirable reluctance may be provided at interfaces between various portions of the magnetic circuit, it is important to minimize such interface or contact reluctances. For mass production, it is also important to provide a method by which low interface reluctances may readily be obtained and controlled, and that maximum values of such interface reluctance be maintained within controlled limits. Such control is especially critical where an elongated magnetic wire, such as a "Wiegand" wire, is to be coupled to a magnetic circuit. This is because the "Wiegand" wire is responsive to changes in its magnetic state when the density of magnetic flux to which it is subject passes through a predetermined value. Since the density of magnetic flux to which the "Wiegand" wire is subject is a function of the reluctance in the magnetic circuit, and particularly the contact reluctance provided in the interface between its ends and the magnetic flux conductive means, the method and means for achieving such coupling is critical, and reliable and accurate control must be achieved for allowing application of mass production techniques.

It is therefore, a principal object of the invention to provide a new and improved method and means for coupling an elongated magnetic device to a magnetic circuit which provides accurate control of interface reluctance.

Another object of the invention is to provide a new and improved method and means for coupling an elongated magnetic device to a magnetic circuit which allows minimization and control of interface reluctance.

Another object of the invention is to provide a new and improved method and means for coupling an elongated magnetic device such as a "Wiegand" wire to a magnetic circuit and controlling the reluctance provided to the circuit.

Another object of the invention is to provide a new and improved method and means for coupling an elongated magnetic device to a magnetic circuit which may easily and accurately be carried out by mass production techniques with control of interface reluctance provided to the magnetic circuit.

Another object of the invention is to provide a new and improved method and means for coupling an elongated magnetic device to a magnetic circuit which is rugged and reliable and readily adapted for various applications.

The above objects, as well as many other objects of the invention are achieved by providing a method for coupling an elongated magnetic device such as a "Wiegand" wire to a magnetic circuit which comprises the steps of shaping the ends of the elongated magnetic device to provide a high ratio of surface area to volume and a contact surface at each end, and connecting the contact surfaces of each end of the magnetic device to a conforming portion of a respective one of a pair of spaced ends of a flux conductive means to provide a magnetic path through the conductive means and magnetic device. The ends of the magnetic device are shaped to form surfaces on opposite sides including a contact surface, while the conductive means includes a pair of members which are formed to provide tapered portions extending towards each other, each with a region to which a respective one of the ends of the magnetic device is connected. The contact surfaces on opposite sides of the ends of the magnetic device are flat surfaces provided by compressing the ends of the magnetic device between dies of a high pressure press. The contact surfaces of the ends of the magnetic device are connected with the conforming portion at the spaced ends of the flux conducting means by electric spot welding, clamping, soldering or application of an adhesive material to the respective contact surfaces.

The invention also provides a coupling means for conducting and subjecting an elongated magnetic device to magnetic flux which comprises a flux conductive means providing a pair of end portions or members each having a region for engaging a respective end of an elongated magnetic device, the end portions of said flux conductive means being positioned with respect to each other to space its regions to correspond to the spacing between the ends of the device. The members have tapered portions which extend toward each other and provide the regions for contacting the ends of the device. The tapered portions of the members are of reduced thickness and each have a flat area for contacting the respective ends of the magnetic device. A positioning and spacing means comprising a plate made of a non-magnetic material supports the members, a signal pick-up coil is wound about and between the ends of the elongated magnetic device, and the members, magnetic device and pick-up coils may be encapsulated in a protective material.

In another form, the flux conductive means includes a third member which extends between the pair of members and provides a bath for magnetic flux shunting the path provided by the magnetic device. The shunt path serves to reduce the reluctance to the circuit provided by the flux path through the magnetic device. The ends of the magnetic device are accurately positioned and secured with the members of the magnetic flux conductive means by spot welding, clamping, soldering or by an adhesive material as noted in connection with the method of the invention.

The above objects of the invention as well as many other objects will become apparent when the following description is read in conjunction with the drawing, in which:

FIG. 1 is a perspective view of an elongated magnetic device such as a "Wiegand" wire, FIG. 2 is a perspective view similar to that of FIG. 1 showing the elongated magnetic device after its ends have been shaped, FIG. 3 is a perspective view of a coupling means made in accordance with the invention, FIG. 4 is a fragmentary perspective view of the right end portion of a modified form of the coupling means illustrated in FIG. 3, showing the use of clamping means for securing an end of the magnetic device with a flux conductive member.

FIG. 5 is a perspective view of a coupling means with applied potting material broken away, which is a modified form of the coupling means shown in FIG. 3, and FIG. 6 is a sectional view taken on the line 6—6 of FIG. 5.

Like reference numerals illustrate like parts throughout the several views.

FIG. 1 is a perspective view illustrating an elongated magnetic device 10 such as a "Wiegand" wire which is substantially round in cross section and is made of a magnetic material. The "Wiegand" wire is described in U.S. Pat. No. 3,820,090 issued June 25, 1974 entitled "Bistable Magnetic Device," and comprises a wire of generally uniform composition having a central relatively "soft" core portion and an outer relatively "hard" magnetized shell portion with relatively high and low coercivities, respectively. Such a wire or device may be made by properly work hardening a homogenous magnetic alloy to provide the relatively hard shell portion of high coercivity with respect to the central core. The device provides a high energy state when its flux extends externally, and a low energy state when its flux is substantially internal. In the low energy state, the flux in the shell has a return path through the core of the device. Switching of the "Wiegand" wire occurs when the density of an applied external flux passes through a value which causes the external flux to capture the core of the device from its shell. This results in a rapid change in external flux density known as the "Wiegand Effect". This effect is detected as an output pulse by a proximately located pick-up coil. This phenomenon, is also explained in detail in an article entitled "Wiegand Wire: New Material For Magnetic-Based Devices" by Philip E. Wigen in Electronics dated July 10, 1975 and in an article entitled "Wiegand Pulses Break Through Into New Applications" in Canadian Control & Instrumentation dated December 1971. Although obtaining low and controlled reluctance for interfacing of a "Wiegand" wire with a magnetic flux conductive means is most important in view of its sensitivity to the density of applied magnetic flux, it is noted that the application of the invention is also relevant for coupling other elongated magnetic devices.

Since the elongated magnetic device 10, may obtain its special properties by work hardening and treatment, it is important that the coupling process does not destroy such desirable properties. This is taken into consideration by the present method which shapes the wire 10 by flattening its ends 12. The device 14 after being shaped or formed is illustrated in FIG. 2 and has a round intermediate portion 16 with flattened ends 18. The flattened ends 18 have top and bottom parallel plane surfaces 20 which are joined with the intermediate portion 16 of the wire 14 by a gradually tapering region 22. In forming the flattened ends 18 of the device 14, the application of any stress to the intermediate portion 16 of the device 14 is minimized. This is important in order that any unique porperties of the device are not destroyed. One type of flattening operation which will minimize undesirable mechanical working, is to slowly deform each end of the device 12 between highly polished hardened steel or carbide flats using a high power hydraulic press. Such action minimizes the zone of disturbed microstructure between the flattened portion or end 18 and the intermediate magnetically active portion 16.

As illustrated for coupling means 44 of FIG. 3, the flattened ends 18 of the device 14 which provide a considerably enlarged contact surface are connected to flat coplanar contact surfaces 24 of a pair of members 26 and 28 of a flux conductive means. The members 26 and 28 may be made of cold rolled steel or other ferromagnetic materials providing high permeability and low coercivity. The members 26 and 28 are provided with end grooves 30 for readily being joined with other portions (not shown) of the flux conducting means for providing magnetic flux from a source to members 26 and 28. Of course, as understood, that other suitable and well known joining means may also be utilized for this purpose. The flat surfaces 24 are provided by an extending portion 32 of each of the members 26 and 28. Each portion 32 is of reduced thickness with respect to the end portion 34 to which it is joined by an intermediate portion 36 having sloping surface 37. The extending portion 32 is also provided with a pair of tapering sides 38 forming a narrowed end portion 40. The portions 32 of each of the members 26 and 28 extend towards each other with their narrowed end portions 40 spaced a distance which is substantially equal to the distance between the flattened ends 18 of the elongated magnetic device 14.

The flattened bottom surface 20 providing an enlarged contact surface at each of the ends 18 of the device 14 is secured with the conforming flat surface 24 at the end portion 40 of each of the members 26 and 28. During the process of connecting the ends 18 of the device 14 with respective members 26 and 28, it is also important that the magnetic properties of the device 14 are preserved. For reducing interface reluctance, each bottom surface 20 of the ends 18 is connected by providing direct contact with the surface 24 of portion 40 of its member 26 and 28 by the use of electric spot welding. This minimizes separation between the contacting surfaces and allows accurate control of the resulting interface reluctance. After a good electric ground contact is made with the members 26 and 28, the ends 18 of the device 14 are firmly held against the surface 24 and the spot welding probe is placed against the top surface 20 of the device 14, and the welding current is activated. This operation is preferably carried out several times to insure good direct contact of the ends 18 with their members 26 and 28. Since the intermediate portion 16 of the device 14 which may be a "Wiegand" wire is not subjected to heat, cooling of this sensitive region is not required. The welded connection also provides a highly durable and rugged physical attachment.

Another method for directly connecting the ends 18 of the device 14 with the members 26 and 28 is shown in FIG. 4 illustrating coupling means 46. As in the case of the welding operation, the bottom surface 20 of each of the ends 18 is applied to the surface 24 of its members 26, 28 previously described to provide direct contact, and clamped in this position by a U-shaped clamping element 41 which may be made of spring steel. An element 41 extends over the top surface 20 of each end 18 of the device 14 and under the extending portion 32 of the members 26, 28 to exert a clamping force therebetween.

Another method by which the enlarged ends 18 of the device 14 may be secured with the members 26 and 28 includes soldering and the use of an adhesive material. When solder or an adhesive material is used, the bottom surface 20 of the ends 18 of the device 14 and the surface 24 of the members 26 and 28 may be spaced from each other by a predetermined controlled distance for accurately determining the interface reluctance between the surfaces. Such connections also provide low reluctance interface junctions and may be used as desirable techniques for appropriate applications. Thus, when the ends 18 of the device 14 are to be soldered with the members 26, 28, the surfaces are first prepared by tinning with an appropriate solder cream. Following the tinning operation, the flat surfaces 20 of the device 14 are soldered to the surfaces 24 of the members 26 and 28 by using for example standard 50:50 lead-tin solder with an activated resin core. When required, the intermediate portion 16 of the device 14 may be cooled during the tinning and soldering steps to prevent loss of magnetic properties of the device 14.

Under appropriate circumstances it may be desirable to apply an adhesive material to the surfaces which are to be connected for securing together the device 14 with the members 26 and 28. In this regard, any adhesive material which will provide a strong bond and provide a desired spacing between the magnetic surfaces may be utilized.

The members 26 and 28 as illustrated in FIGS. 3 and 4 are preferrably secured with a supporting plate 42 prior to the attachment of the device 14. The members 26 and 28 may be secured with the plate 42 by a suitable adhesive material, bolts, clamps or other conventional means. In one form, the plate 42 is made of a non-magnetic material for spacing the members 26, 28 from each other with their tapered portion 32 extending in a direction towards each other to provide the respective coupling means 44 and 46. In another form the plate can be of a magnetic material for the purpose which will be explained in connection with the operation of the coupling means.

The magnetic device 14 where desirable may have a signal pick-up coil 48 wound about it between its ends 18 for providing output signals with the change in magnetic state as in the case when the device 14 is a "Wiegand" wire. Of course, such output signals may also be derived by a coil positioned proximate to the magnetic device 14, so that the coil 48 may not be required. The winding 48 may be received about the magnetic device 14 either before or after the device 14 is secured with the end members 26, 28. In the event that the coil 48 which may be in the form of a fine wire having an insulating coating is received about the magnetic device 14 prior to its attachment, it should be wound about the intermediate portion 16 and sufficiently removed from the ends 18 to prevent damage during the connecting operations.

The coupling means 44 and 46 may also be encapsulated in a suitable insulating material in a conventional manner for protecting the magnetic device 14, its connections with the end members 26 and 28 and the signal pick-up coil 48 where it is utilized, and providing a rugged structure.

FIGS. 5 and 6 illustrate a coupling means 50 which is a modified form of the coupling means 44 and 46 of FIGS. 3 and 4 and made using the same method described above. Because of the similarity between the coupling means 50 and the means 44 and 46, the distinguishing differences will be described in detail. The means 50 includes a pair of end members 26' and 28' joined by a connecting member 52 also made of a material having a high permeability and low coercivity. The member 52 joins the extending portions 32' of the members 26' and 28' and is positioned below and in parallel spaced relationship with the elongated magnetic device 14. The configuration and cross-section of the member 52 may be varied to provide a magnetic path of desired reluctance in shunt with the flux path provided by the elongated magnetic member 14.

If desired the members 26' and 28' may be secured with a supporting plate 42 and encapsulated in an insulating material 54 as noted in connection with the devices 44 and 46.

A path for magnetic flux shunting the magnetic device 14 may also be provided as noted previously for the magnetic coupling means 44 and 46 in which the plate 42 is made of a magnetic material of high permeability and low coercivity. The desirability of such a shunt path will be described in connection with the operation of the coupling means 44, 46 and 50.

In operation, the coupling means 44, 46 and 50, each conduct magnetic flux from a magnetic source and subject an elongated magnetic device 14 to flux from such sources. The flux may be considered to flow from the source in a direction from end member 26 to end member 28. In doing this, the flux in the member 26 flows from the end portion 34 towards its extending portion 32. The cross section of the end member 26 decreases in the direction of flow through the tapered section 36 and is then further reduced by the tapered side walls 38 of the extending portion 32 to its end portion 40 where it contacts the end 18 of the magnetic device 14. The lines of magnetic flux are thus gradually concentrated for passing through the interface provided by the enlarged contact at the surface 20 at the end 18. The end 18 is secured as previously described with the end member 26 to provide an interface of low reluctance. The lines of flux are then directed into and along the magnetic device 14 to its other end 18. The other end 18 provides an enlarged contact at its surface 20 providing an interface of low reluctance with the end portion 40 of the member 28. Passing from the extending portion 32, the cross section of the member 28 increases in the direction of flux flow toward its end portion 34, reversing the concentrating effect previously described in connection with the end member 26 and completing the transition through the coupling means.

In considering the opposingly spaced extending portions 32 of the members 26 and 28, it is noted that because of the reduced cross section and the tapered side walls 38, an air gap is presented between them which is educed between the end portions 40, across which the magnetic device 14 is joined. This arrangement and configuration of the end members 26 and 28 and the connection of the device 14 therebetween, controls the concentration and flow of magnetic flux between the end members 26 and 28 so that the flux is concentrated in and most effectively flows through the magnetic device 14. The importance of controlling the flux flow and density of flux, was previously noted in connection with the "Wiegand" wire which is activated from one state to another as the flux density passes through a predetermined value. The bridging or fringing of magnetic flux about and through the elongated magnetic member 14, is thus most critical, and its control is achieved by the low reluctance interfaces, as well as by the configurations of both the members 26 and 28 and of the elongated member 14, and the locations of the interfaces. The reliability of operation of the elongated magnetic device 14, is dependent upon the density of magnetic flux to which it is subject and to the variation of the flux through the predetermined value. Thus, the essential maintenance of highly stable and minimized interface reluctance values and a predetermined magnetic path through the coupling means are provided by the invention.

The use of a shunt path for flux is provided by the member 52 between the end members 26' and 28' of FIGS. 5 and 6 is also useful for achieving the desired stability and operating conditions for the magnetic device 14. Since the elongated magnetic member 14 may provide a higher reluctance to the magnetic circuit than is desirable, the shunt path of the member 52 by-passes magnetic flux, and reduces the total reluctance of the coupling means 50 to a lower value which may be desired for certain design circumstances. Thus, in a magnetic circuit where a variable high reluctance is utilized for varying the magnetic flux provided to the magnetic device 14, reduced reluctance provided by the coupling means 50, allows more effective flux control by the variable reluctance. Also in a situation where the flux provided to the magnetic device 14 has a value greater than that desired for its proper operation, the shunt path 52 reduces the flux density to the desirable value. The shunt path provided by member 52, thus, also allows control of the reluctance of the coupling means 50 to the magnetic circuit, as well as controlling the proportion or density of magnetic flux passing through the magnetic device 14.

The disclosed method and means for coupling an elongated magnetic device 14 to a magnetic circuit provides critical control of the magnetic flux to which the elongated magnetic device 14 is subject, and allows coupling of the magnetic device with minimum reluctance and high stability and reliability. The invention also allows control of reluctance provided to a magnetic circuit, and the density of magnetic flux to which the magnetic device is subject, while providing a method and means which is easy and accurately carried out by mass production techniques.

It will, of course, be understood that the description and drawing herein contained are illustrative merely, and that various modifications and changes may be made in the method and means disclosed without departing from the spirit of the invention.

What is claimed is:

1. A method for coupling an elongated magnetic device to a magnetic circuit comprising the steps of
shaping the ends of an elongated magnetic device to provide a high ratio of surface area to volume and a contact surface at each end,
positioning and spacing the ends of a pair of members of a flux conductive means with respect to each other and securing them with a supporting means, and
connecting the contact surface of each end of said magnetic device to a conforming portion of a respective one of the pair of spaced ends of the flux conductive means to provide a magnetic path through said conductive means and magnetic device and connections of high permeability and low coercivity therebetween.

2. The method of claim 1 in which the ends of said device are shaped to form surfaces on opposite sides including a contact surface, and said conductive means includes a pair of members which are formed to provide tapered portions extending toward each other with a region to which the ends of said magnetic device are respectively connected.

3. The method of claim 1 in which the ends of the magnetic device are shaped by being compressed to provide flat surfaces on opposite sides, and said members are each formed to provide a reduced thickness in the region of its tapered portion and a flat area for contacting a respective end of said magnetic device.

4. The method of claim 1 in which the contact surface of each end of said magnetic device is connected by soldering to the conforming portion of its respective one of said pair of ends of said conductive means.

5. The method of claim 1 in which the contact surface of each end of said magnetic device is connected by an adhesive material to the conforming portion of its respective one of said pair of ends of said conductive means.

6. The method of claim 1 in which the contact surface of each end of said magnetic device directly contacts the conforming portion of its respective one of said pair of ends of said conductive means.

7. The method of claim 6 in which the ends of said magnetic device are connected by electric welding with said conductive means.

8. The method of claim 6 in which the ends of said magnetic device are connected by clamping them to said conductive means.

9. A coupling means for conducting and subjecting an elongated magnetic device to magnetic flux comprising a flux conductive means providing a pair of end portions of respective first and second members of high permeability and low coercivity each having a region for engaging a respective end of an elongated magnetic device, the end portions of said flux conductive means being positioned with respect to each other to space its regions to correspond to the spacing between the ends of said device, and means positioning and spacing said members.

10. The coupling means of claim 9 in which said conductive means includes first and second members having tapered portions extending toward each other and providing said regions for contacting the ends of said device.

11. The coupling means of claim 9 in which the regions of the tapered portions of said first and second members are of reduced thickness and each have a flat area for contacting its respective end of said magnetic device.

12. In combination, an elongated magnetic device, and a coupling means for subjecting said magnetic device to magnetic flux comprising a flux conductive means having a high permeability and low coercivity providing a pair of spaced end portions of first and second members each having a region connected with a respective end of said magnetic device to provide a magnetic path through said conductive means and magnetic device, the end portions of said flux conductive means being positioned with respect to each other to space its regions to correspond to the spacing between the ends of said device, and means positioning and spacing said members.

13. The combination of claim 12 in which the ends of said magnetic device provide a high ratio of surface area to volume and a contact surface, and the first and second members have tapered portions extending toward each other and providing said regions for contacting the ends of said device.

14. The combination of claim 12 in which the ends of said magnetic device are each provided with a flat contact surface, and the regions of the tapered portions of said first and second members are of reduced thickness and each have a flat area for engaging a respective flat contact surface of said magnetic device.

15. The combination of claim 12, 13 or 14 in which the ends of said magnetic device are directly connected by spot welds with said coupling means.

16. The combination of claim 12, 13 or 14 including clamping means for directly connecting the ends of said magnetic device with said coupling means.

17. The combination of claim 12, 13 or 14 in which the ends of said magnetic device are connected by solder with said coupling means.

18. The combination of claim 12, 13 or 14 in which the ends of said magnetic device are connected by an adhesive with said coupling means.

19. A method for coupling an elongated magnetic device to a magnetic circuit comprising the steps of
shaping by compressing the ends of an elongated magnetic device to provide a high ratio of surface area to volume and to form flat surfaces on opposite sides including a contact surface, and
connecting the contact surface of each end of said magnetic device to a conforming portion of a respective one of a pair of spaced ends of first and second members of a flux conductive means made of material providing high permeability and low coercivity to provide a magnetic path through said conductive means and magnetic device,
the members of the conductive means being formed to provide tapered portions extending toward each other having a region of reduced thickness and a flat contacting area to which the ends of said magnetic device are respectively connected, and the flat contacting areas of said members being coplanar.

20. A method for coupling an elongated magnetic device to a magnetic circuit comprising the steps of
shaping by compressing the ends of an elongated magnetic device to provide a high ratio of surface area to volume and to form flat surfaces on opposite sides including a contact surface,
connecting the contact surface of each end of said magnetic device to a conforming portion of a respective one of a pair of spaced ends of first and second members of a flux conductive means to provide a magnetic path through said conductive means and magnetic device, the members being formed to provide tapered portions extending toward each other having a region of reduced thickness and a flat contacting area to which the ends of said magnetic device are respectively connected, and
positioning and spacing said members with respect to each other and securing them with a supporting means prior to the step of connecting said magnetic device to said flux conductive means.

21. The method of claim 20 which includes the step of winding a pick-up coil about and along the region between the ends of said magnetic device prior to the step of connecting its ends to said flux conductive means.

22. The method of claim 21 including the step of encapsulating at least a portion of the spaced ends of said conductive means, said magnetic device and said pick up coil in a protective material.

23. A method for coupling an elongated magnetic device to a magnetic circuit comprising the steps of
shaping the ends of an elongated magnetic device to provide a high ratio of surface area to volume and a contact surface at each end,
connecting by soldering the contact surface of each end of said magnetic device to a conforming portion of a respective one of a pair of spaced ends of a flux conductive means to provide a magnetic path through said conductive means and magnetic device, and
cooling the portion of said magnetic device intermediate its ends during the connecting step.

24. A coupling means for conducting and subjecting an elongated magnetic device to magnetic flux comprising a flux conductive means including first and second members with respective tapered end portions of reduced thickness extending toward each other and each having a region with a flat area for engaging a respective end of an elongated magnetic device, the end portions of said flux conductive means being positioned with respect to each other to space its regions to correspond to the spacing between the ends of said device, said flat areas of said first and second members being coplanar, and said members having a high permeability and low coercivity and being provided with joining means for being secured with means for receiving magnetic flux from a magnetic source.

25. A coupling means for conducting and subjecting an elongated magnetic device to magnetic flux comprising a flux conductive means including first and second members with respective tapered end portions of reduced thickness extending toward each other and each having a region with a flat area for engaging a respective end of an elongated magnetic device, the end portions of said flux conductive means being positioned with respect to each other to space its regions to correspond to the spacing between the ends of said device, said members having a high permeability and low coercivity, and positioning and spacing means supporting said members.

26. The coupling means of claim 25 in which said positioning and spacing means comprises a plate made of a nonmagnetic material supporting said members.

27. The coupling means of claim 26 which includes a signal pick-up coil wound about and between the ends of said elongated magnetic device.

28. A coupling means for coupling and subjecting an elongated magnetic device to magnetic flux comprising a flux conductive means providing a pair of end portions each having a region for engaging a respective end of an elongated magnetic device, the end portions of said flux conductive means being positioned with respect to each other to space its regions to correspond to the spacing between the ends of said device, said flux conductive means including a third member extending between said pair of members and providing a path for magnetic flux shunting the path provided by said magnetic device.

29. The coupling means of claim 28 in which said conductive means includes first and second members having tapered portions extending toward each other and providing said regions for contacting the ends of said device, and the regions of the tapered portions of said first and second members are of reduced thickness and each have a flat area for contacting its respective end of said magnetic device.

30. The coupling means of claim 29 which includes positioning and spacing means supporting said members, and said members have a high permeability and low coercivity.

31. The coupling means of claim 30 in which said positioning and spacing means comprises a plate made of a nonmagnetic material supporting said first and second members, and includes a signal pick-up coil wound about and between the ends of said elongated magnetic device.

32. The coupling means of claim 27 or 31 in which said members, magnetic device and pick-up coil are encapsulated in a protective material.

33. In combination, an elongated magnetic device comprising a bistable magnetic wire, and a coupling means for subjecting said magnetic device to magnetic flux comprising a flux conductive means including first and second members with respective tapered end portions of reduced thickness extending toward each other and each having a region with a flat area connected with a respective end of said magnetic device to provide a magnetic path through said conductive means and magnetic device, the end portions of said flux conductive means being positioned with respect to each other to space its regions to correspond to the spacing between the ends of said device, the ends of said magnetic device providing a high ratio of surface area to volume and a flat contact surface, the flat areas of said first and second members being coplanar and said members having a high permeability and low coercivity.

34. In combination, an elongated magnetic device, a coupling means for subjecting said magnetic device to magnetic flux comprising a flux conductive means including first and second members with respective tapered end portions of reduced thickness extending toward each other and each having a region with a flat area connected with a respective end of said magnetic device to provide a magnetic path through said conductive means and magnetic device, the end portions of said flux conductive means being positioned with respect to each other to space its regions to correspond to the spacing between the ends of said device, the ends of said magnetic device providing a high ratio of surface area to volume and a flat contact surface, said members having a high permeability and low coercivity, and positioning and spacing means supporting said members.

35. The combination of claim 34 in which said positioning and spacing means comprises a plate made of a nonmagnetic material supporting said members.

36. The combination of claim 35 which includes a signal pick-up coil wound about and between the ends of said elongated magnetic device.

37. In combination, an elongated magnetic device, a coupling means for subjecting said magnetic device to magnetic flux comprising a flux conductive means including first and second members with respective tapered end portions of reduced thickness extending toward each other and each having a region with a flat area connected with a respective end of said magnetic device to provide a magnetic path through said conductive means and magnetic device, the end portions of said flux conductive means being positioned with respect to each other to space its regions to correspond to the spacing between the ends of said device, the ends of said magnetic device providing a high ratio of surface area to volume and a flat contact surface, said members having a high permeability and low coercivity, and a third member extending between said first and third members and providing a path for magnetic flux shunting the path provided by said magnetic device.

38. In combination, an elongated magnetic device, and a coupling means for subjecting said magnetic device to magnetic flux comprising a flux conductive means providing a pair of spaced end portions each having a region connected with a respective end of said magnetic device to provide a magnetic path through said conductive means and magnetic device, the end portions of said flux conductive means being positioned with respect to each other to space its regions to correspond to the spacing between the ends of said device, said flux conductive means including a third member extending between said pair of members and providing a path for magnetic flux shunting the path provided by said magnetic device.

39. The combination of claim 38 in which said conductive means includes first and second members having tapered portions extending toward each other and providing said regions for contacting the ends of said device, and the regions of the tapered portions of said first and second members are of reduced thickness and each have a flat area for contacting its respective end of said magnetic device.

40. The combination of claim 39 which includes positioning and spacing means supporting said members, and said members have a high permeability and low coercivity.

41. The combination of claim 40 in which said positioning and spacing means comprises a plate made of a nonmagnetic material supporting said first and second members, and includes a signal pick-up coil wound about and between the ends of said elongated magnetic device.

42. The combination of claim 41 in which said members, magnetic device and pick-up coil are encapsulated in a protective material.

* * * * *